US012621982B2

(12) United States Patent
Ai

(10) Patent No.: US 12,621,982 B2
(45) Date of Patent: May 5, 2026

(54) SEMICONDUCTOR DEVICE WITH PAD STRUCTURE AND METHOD FOR FABRICATING THE SAME

(71) Applicant: NANYA TECHNOLOGY CORPORATION, New Taipei City (TW)

(72) Inventor: Tsu-Chieh Ai, Taitung City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 364 days.

(21) Appl. No.: 18/377,424

(22) Filed: Oct. 6, 2023

(65) Prior Publication Data

US 2024/0040771 A1      Feb. 1, 2024

Related U.S. Application Data

(63) Continuation of application No. 17/484,988, filed on Sep. 24, 2021, now Pat. No. 11,832,439.

(51) Int. Cl.
*H10B 12/00*          (2023.01)
(52) U.S. Cl.
CPC ....... *H10B 12/315* (2023.02); *H10B 12/0335* (2023.02); *H10B 12/053* (2023.02); *H10B 12/34* (2023.02); *H10B 12/482* (2023.02)

(58) Field of Classification Search
None
See application file for complete search history.

(56) References Cited

U.S. PATENT DOCUMENTS

| | | | | |
|---|---|---|---|---|
| 2013/0264638 A1* | 10/2013 | Jang | .................... | H10W 20/076 |
| | | | | 257/334 |
| 2014/0291804 A1* | 10/2014 | Kim | ...................... | H10B 12/50 |
| | | | | 257/532 |
| 2019/0096890 A1* | 3/2019 | Lee | ......................... | H10B 12/34 |
| 2021/0091088 A1* | 3/2021 | Tsai | .................... | H10B 12/0335 |

* cited by examiner

*Primary Examiner* — Brent A. Fairbanks
*Assistant Examiner* — Derek L Nielsen
(74) *Attorney, Agent, or Firm* — Xuan Zhang

(57)          ABSTRACT

The present application discloses a semiconductor device and a method for fabricating the semiconductor device. The semiconductor device includes a substrate; a pad structure positioned above the substrate and including a bottom portion and two side portions, wherein the bottom portion is positioned parallel to a top surface of the substrate, and the two side portions are positioned on two sides of the bottom portion and extending along a direction parallel to a normal of the top surface of the substrate; and an insulator film surrounding the pad structure. A top surface of the insulator film is at a vertical level greater than a vertical level of a top surface of the pad structure.

8 Claims, 23 Drawing Sheets

10

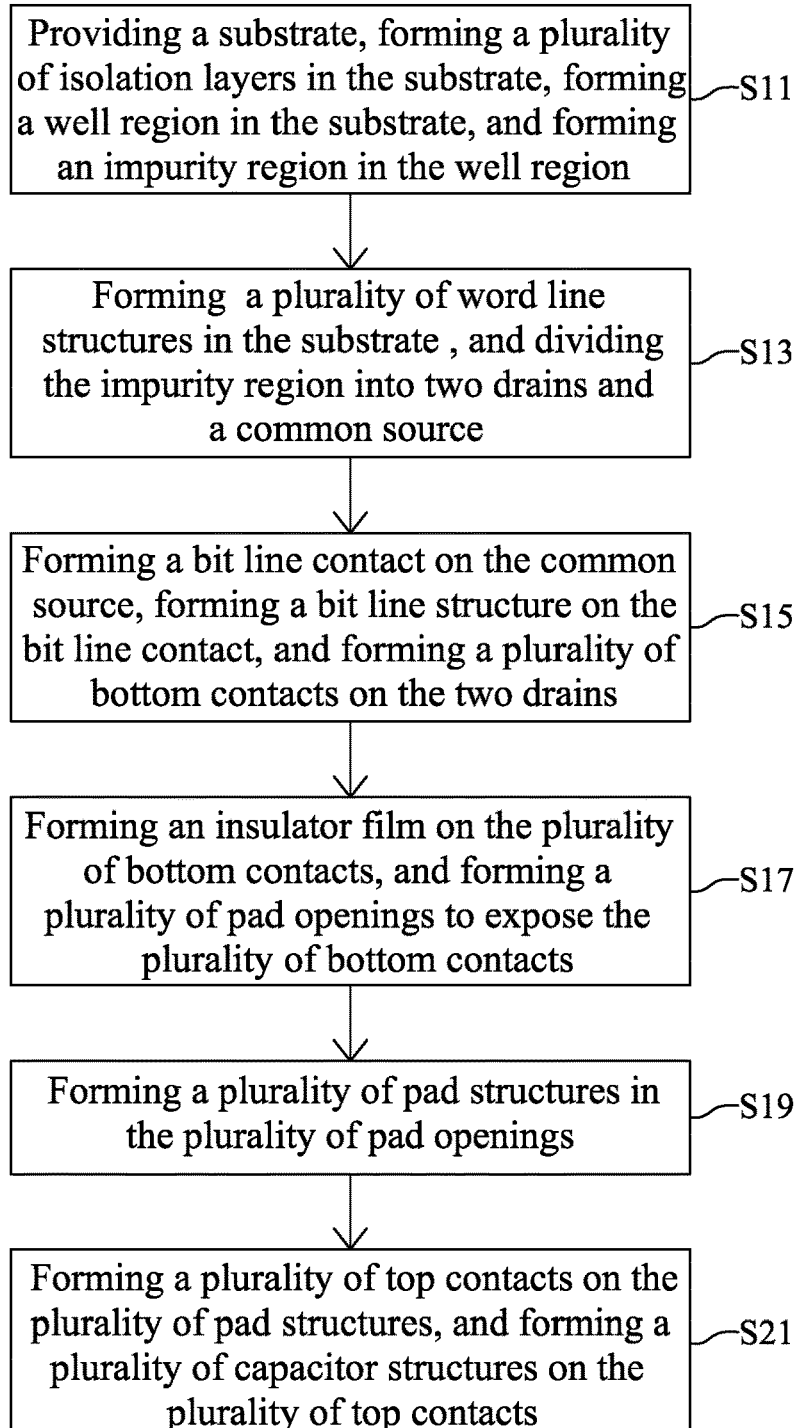

Providing a substrate, forming a plurality of isolation layers in the substrate, forming a well region in the substrate, and forming an impurity region in the well region — S11

Forming a plurality of word line structures in the substrate , and dividing the impurity region into two drains and a common source — S13

Forming a bit line contact on the common source, forming a bit line structure on the bit line contact, and forming a plurality of bottom contacts on the two drains — S15

Forming an insulator film on the plurality of bottom contacts, and forming a plurality of pad openings to expose the plurality of bottom contacts — S17

Forming a plurality of pad structures in the plurality of pad openings — S19

Forming a plurality of top contacts on the plurality of pad structures, and forming a plurality of capacitor structures on the plurality of top contacts — S21

FIG. 1

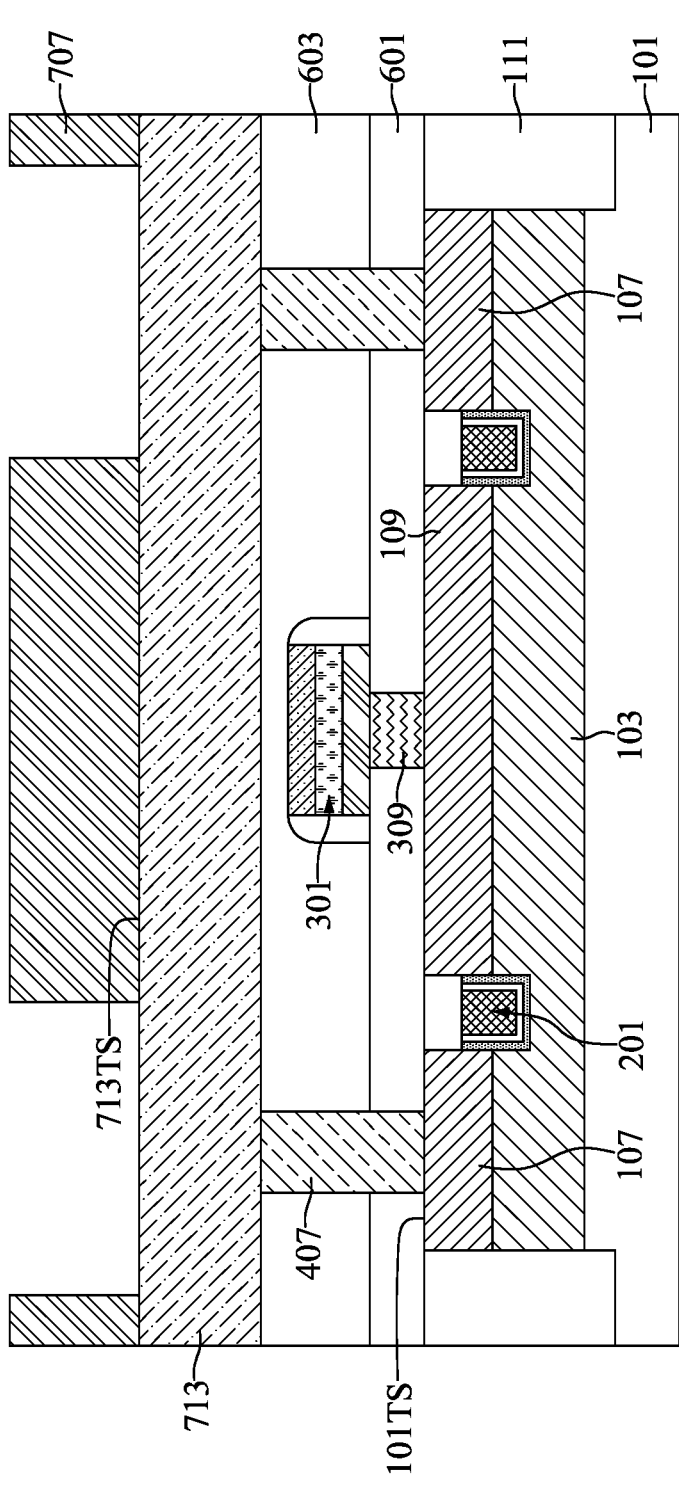
FIG. 10

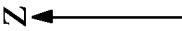
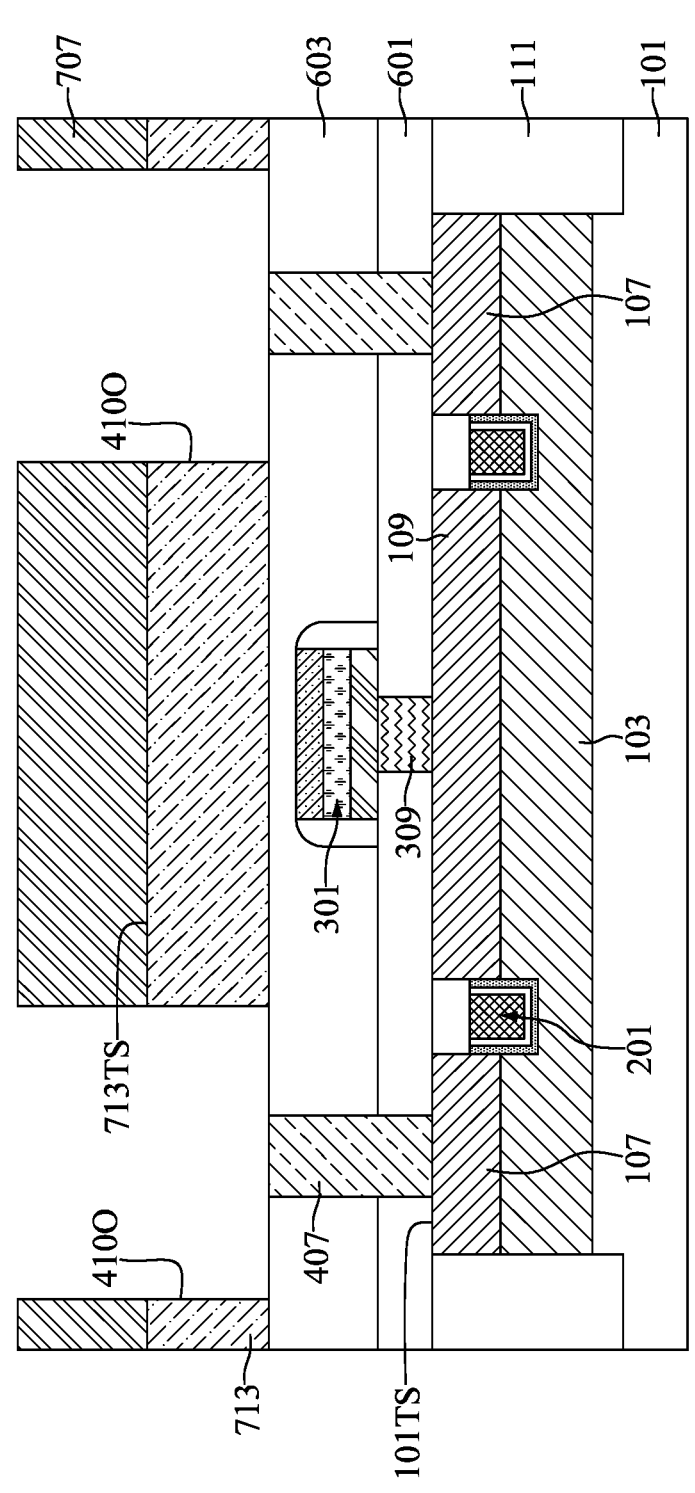
FIG. 11

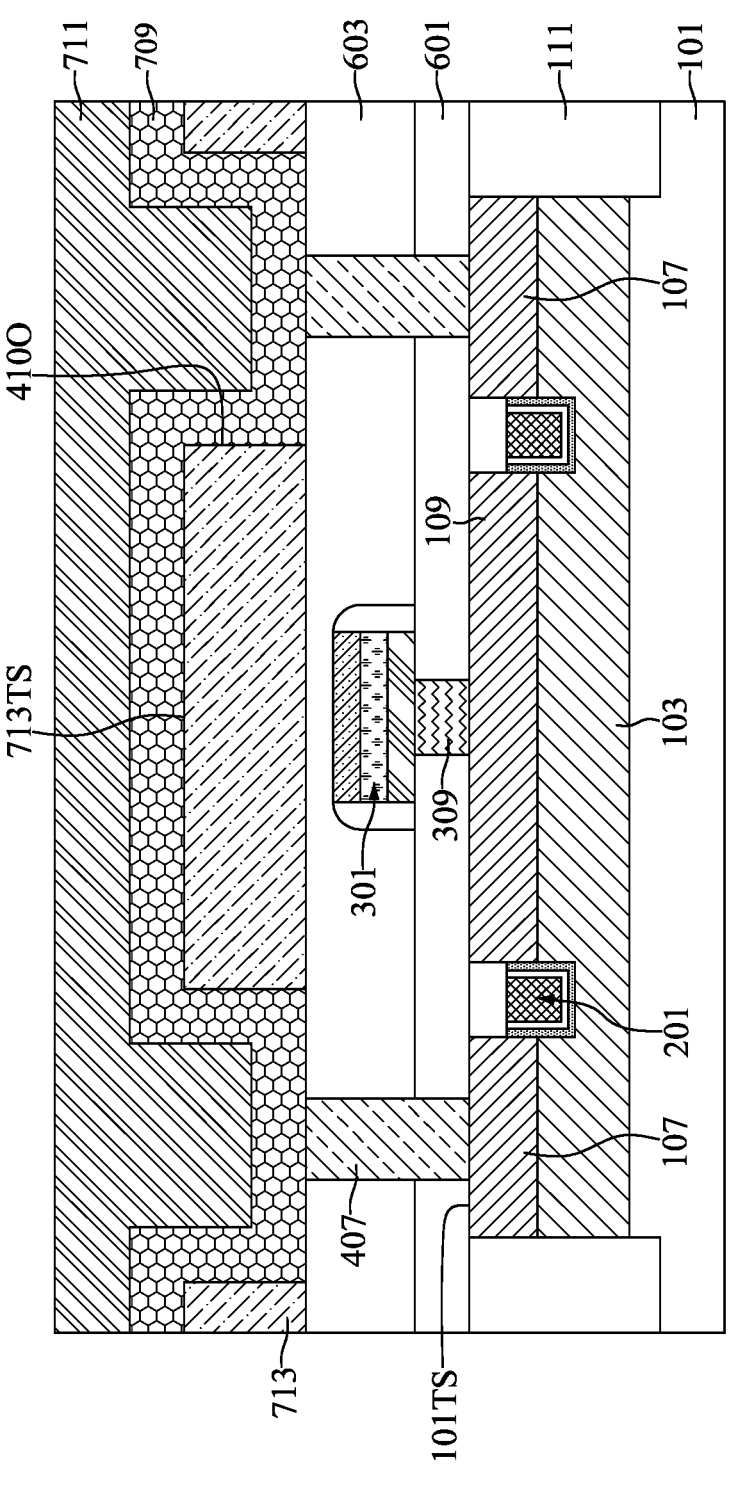
FIG. 14

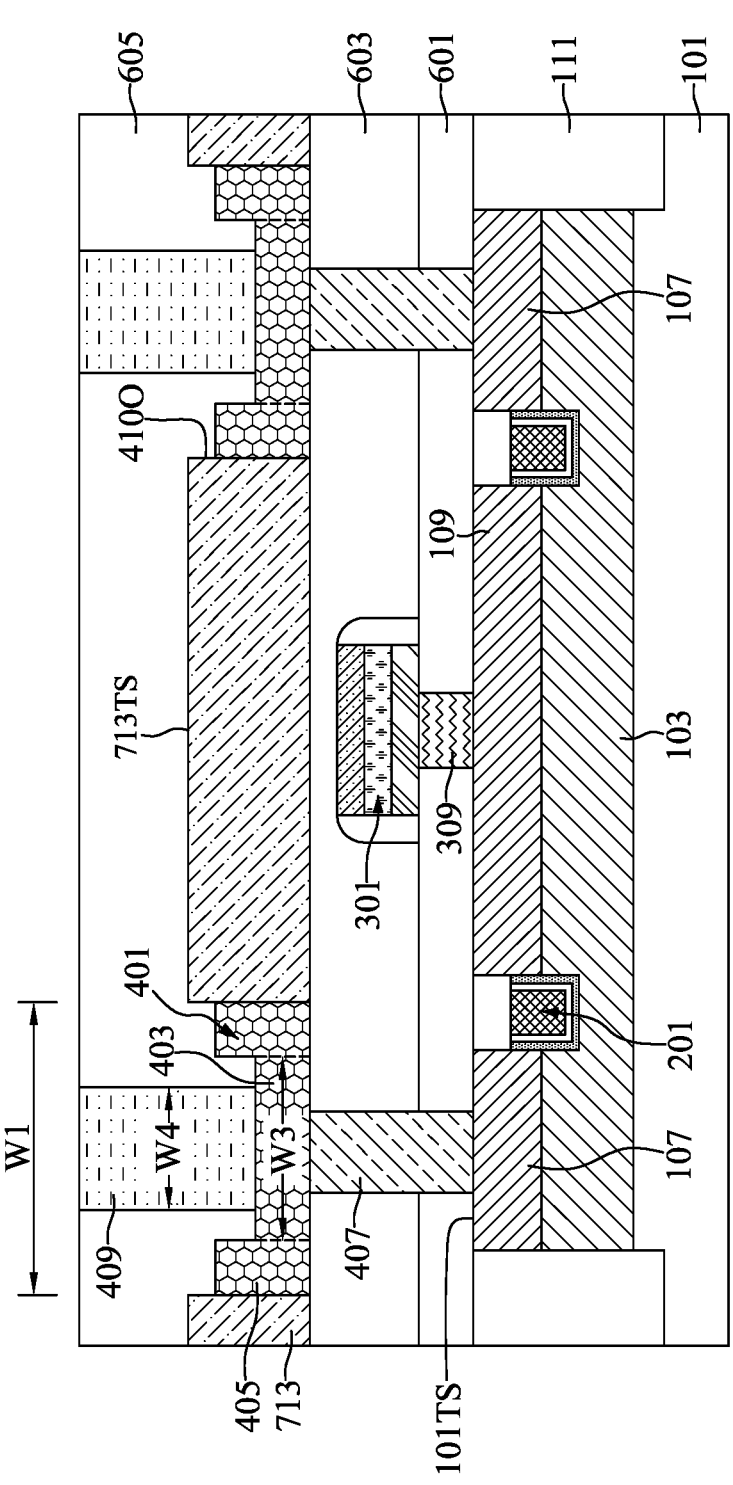
FIG. 16

SEMICONDUCTOR DEVICE WITH PAD STRUCTURE AND METHOD FOR FABRICATING THE SAME

CROSS-REFERENCE TO RELATED APPLICATION

This application is a continuation application of U.S. Non-Provisional application Ser. No. 17/484,988 filed Sep. 24, 2021, which is incorporated herein by reference in its entirety.

TECHNICAL FIELD

The present disclosure relates to a semiconductor device and a method for fabricating the semiconductor device, and more particularly, to a semiconductor device with a pad structure and a method for fabricating the semiconductor device the pad structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a pad structure positioned above the substrate and including a bottom portion and two side portions, wherein the bottom portion is positioned parallel to a top surface of the substrate, and the two side portions are positioned on two sides of the bottom portion and extending along a direction parallel to a normal of the top surface of the substrate; and an insulator film surrounding the pad structure. A top surface of the insulator film is at a vertical level greater than a vertical level of a top surface of the pad structure.

In some embodiments, top surfaces of the two side portions are at a vertical level greater than a vertical level of a top surface of the bottom portion.

In some embodiments, the top surfaces of the two side portions have a rounding cross-sectional profile.

In some embodiments, the semiconductor device includes a bottom contact positioned under the pad structure and contacting the pad structure.

In some embodiments, the semiconductor device includes a top contact positioned on the pad structure.

In some embodiments, a width of the top contact is less than a width of the pad structure.

In some embodiments, a width of the top contact is greater than a width of the bottom portion.

In some embodiments, a width of the top contact is less than a width of the bottom portion.

In some embodiments, the semiconductor device includes a drain positioned in the substrate and electrically coupled to the pad structure through the bottom contact.

In some embodiments, the semiconductor device includes a capacitor structure positioned above the pad structure and electrically coupled to the pad structure through the top contacts.

Another aspect of the present disclosure provides a method for fabricating a semiconductor device including providing a substrate including a top surface; forming a dielectric layer on the substrate; forming an insulator film on the dielectric layer; patterning the insulator film to form a pad opening along the insulator film and expose a portion of the dielectric layer; conformally forming a layer of first conductive material on a top surface of the insulator film and in the pad opening; forming an under layer to completely fill the pad opening; and removing the layer of first conductive material formed on the top surface of the insulator film to form a pad structure. The pad structure includes a bottom portion and two side portions, the bottom portion is formed parallel to the top surface of the substrate, and the two side portions are formed on two sides of the bottom portion and extending along a direction parallel to a normal of the top surface of the substrate.

In some embodiments, the under layer includes a photoresist material.

In some embodiments, an isotropic etch process is performed to remove the layer of first conductive material formed on the top surface of the insulator film.

In some embodiments, the method for fabricating the semiconductor device includes forming a bottom contact in the dielectric layer. The bottom contact is electrically connected to the pad structure.

In some embodiments, the method for fabricating the semiconductor device includes forming a top contact on the bottom portion of the pad structure.

In some embodiments, the method for fabricating the semiconductor device includes forming a top contact on the bottom portion and the two side portions of the pad structure.

In some embodiments, the method for fabricating the semiconductor device includes forming a capacitor structure on the top contact. The capacitor structure is electrically coupled to the pad structure through the top contact.

In some embodiments, the pad structure includes tungsten, titanium nitride, copper, aluminum, or a combination thereof.

In some embodiments, the method for fabricating the semiconductor device includes forming a drain in the substrate. The drain is electrically coupled to the pad structure through the bottom contact.

In some embodiments, the insulator film includes silicon oxide, borophosphosilicate glass, undoped silicate glass, fluorinated silicate glass, or a low-k dielectric material.

Due to the design of the semiconductor device of the present disclosure, the pre-defined pad openings in the insulator film and subsequently formed pad structures may prevent the risk of under etching during a blanket metal etch process. As a result, the yield of fabrication of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1 illustrates, in a flowchart diagram form, a method for fabricating a semiconductor device in accordance with one embodiment of the present disclosure;

FIGS. 2 to 17 illustrate, in schematic cross-sectional view diagrams, a flow for fabricating the semiconductor device in accordance with one embodiment of the present disclosure;

DETAILED DESCRIPTION

Figure 2:
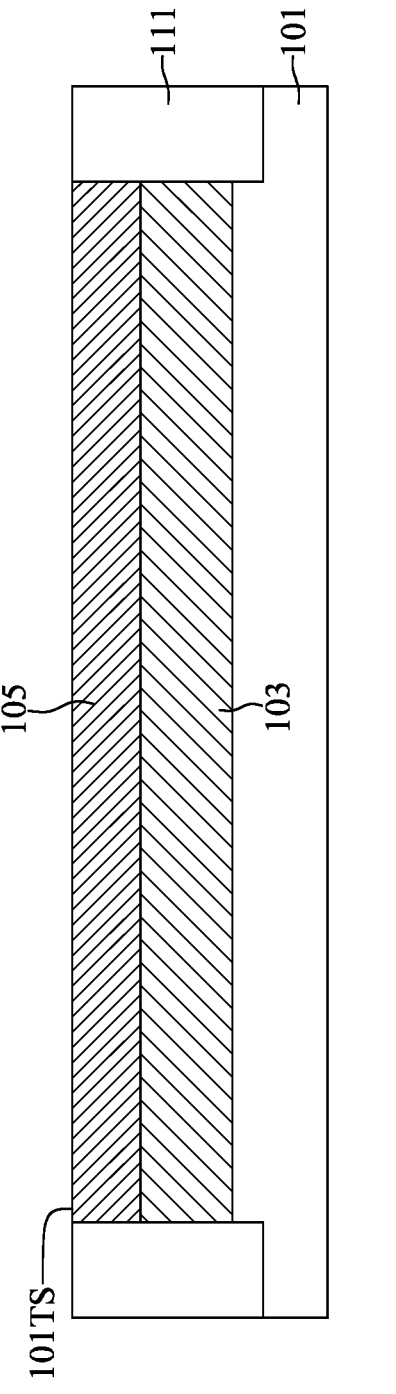

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

FIG. 1 illustrates, in a flowchart diagram form, a method 10 for fabricating a semiconductor device 1A in accordance with one embodiment of the present disclosure. FIGS. 2 to 17 illustrate, in schematic cross-sectional view diagrams, a flow for fabricating the semiconductor device 1A in accordance with one embodiment of the present disclosure.

With reference to FIGS. 1 and 2, at step S11, a substrate 101 may be provided, a plurality of isolation layers 111 may be formed in the substrate 101, a well region 103 may be formed in the substrate 101, and an impurity region 105 may be formed in the well region 103.

With reference to FIG. 2, the substrate 101 may include a bulk semiconductor substrate that is composed of at least one semiconductor material. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may include a semiconductor-on-insulator structure which is consisted of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and about 200 nm. The insulator layer may eliminate leakage current between adjacent elements in the substrate 101 and reduce parasitic capacitance associated with source/drains as will be illustrated later.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 2, a series of deposition processes may be performed to deposit a pad oxide layer (not shown in FIG. 2) and a pad nitride layer (not shown in FIG. 2) on the substrate 101. A photolithography process may be performed to define the position of the isolation layer 111. After the photolithography process, an etch process, such as an anisotropic dry etch process, may be performed to form trenches penetrating through the pad oxide layer, the pad nitride layer, and the substrate 101. An insulating material may be deposited into the trenches and a planarization process, such as chemical mechanical polishing, may be subsequently performed to remove excess filling material until a top surface 101TS of the substrate 101 is exposed so as to form the plurality of isolation layers 111. The top surfaces of the plurality of isolation layers 111 and the top surface 101TS of the substrate 101 may be substantially coplanar.

It should be noted that, in the description of the present disclosure, a surface of an element (or a feature) located at the highest vertical level along the dimension Z is referred to as a top surface of the element (or the feature). A surface of an element (or a feature) located at the lowest vertical level along the dimension Z is referred to as a bottom surface of the element (or the feature).

It should be noted that, in the description of the present disclosure, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

With reference to FIG. 2, the well region 103 may be formed in the substrate 101 and between the plurality of isolation layers 111. The well region 103 may be formed by an implantation using, for example, p-type dopants. The well region 103 may have a first electrical type (i.e., the p-type). The term "p-type dopant" refers to an impurity that when added to an intrinsic semiconductor material creates to deficiencies of valence electrons. In a silicon containing semiconductor material, examples of p-type dopants include, but are not limited to, boron, aluminum, gallium and/or indium.

With reference to FIG. 2, the impurity region 105 may be formed in the well region 103 and between the plurality of isolation layers 111. The top surface of the impurity region 105 may be substantially coplanar with the top surface 101TS of the substrate 101. The impurity region 105 may be formed by an implantation using, for example, n-type dopants. The term "n-type dopant" refers to an impurity that when added to an intrinsic semiconductor material contributes free electrons to the intrinsic semiconductor material. In a silicon containing material, examples of n-type dopants include, but are not limited to, antimony, arsenic and/or phosphorus. The impurity region 105 may have a second electrical type (i.e., the n-type) different from the first electrical type of the well region 103. In some embodiments, the dopant concentration of the impurity region 105 may be greater than the dopant concentration of the well region 103. In some embodiments, the concentration of dopants within the impurity region 105 may be in a range from $4 \times 10^{\circ}20$ atoms/cm$^{\circ}3$ to $2 \times 10^{\circ}21$ atoms/cm$^{\circ}3$; although other dopant concentrations that are lesser than, or greater than, the aforementioned range may also be employed in the present application.

In some embodiments, an annealing process may be performed to activate the well region 103 and the impurity region 105. The annealing process may have a process temperature between about 800° C. and about 1250° C. The annealing process may have a process duration between about 1 millisecond and about 500 milliseconds. The annealing process may be, for example, a rapid thermal anneal, a laser spike anneal, or a flash lamp anneal.

Figure 3:
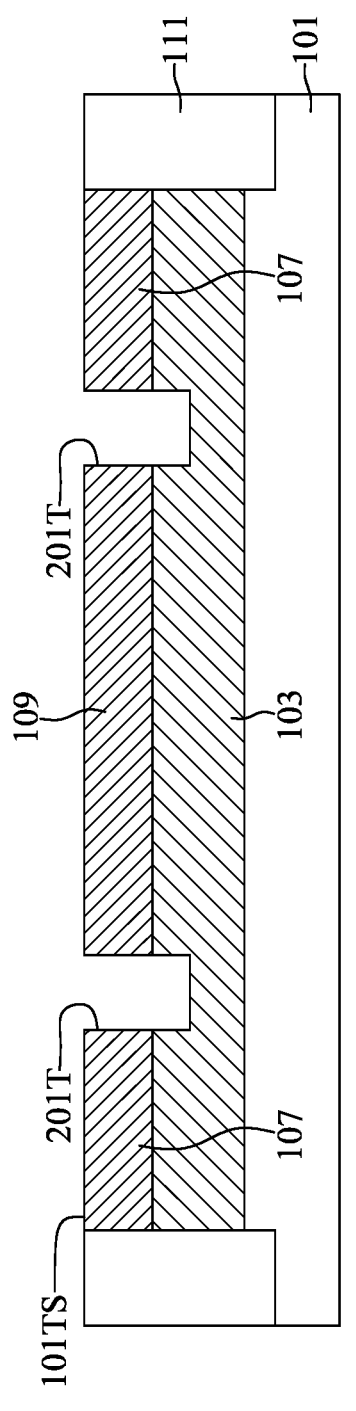
Figure 4:
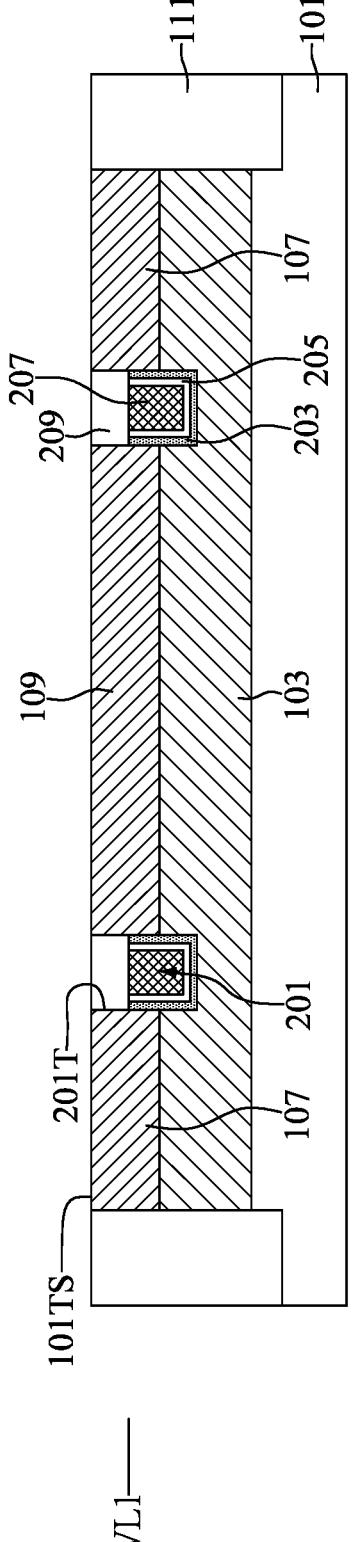

With reference to FIGS. 1, 3, 4, at step S13, a plurality of word line structures 201 may be formed in the substrate 101 and the impurity region 105 may be divided into two drains 107 and a common source 109 by the plurality of word line structures 201.

With reference to FIG. 3, a plurality of trenches 201T may be formed in the substrate 101. The plurality of trenches 201T may be formed by an etch process using a mask pattern (not shown for clarity) formed on the substrate 101 as an etch mask. The plurality of trenches 201T may have a sufficient depth to increase an average cross-sectional area of the plurality of word line structures 201 as will be illustrated later. For example, the bottom surfaces of the plurality of trenches 201T may be located in the well region 103. In some embodiments, the bottom surfaces of the plurality of trenches 201T may have a curvature to facilitate the formation of the plurality of word line structures 201. In some embodiments, the plurality of trenches 201T may have a line shape traversing the impurity region 105. That is, the plurality of trenches 201T may extend along a direction perpendicular to the plane of FIG. 3.

With reference to FIG. 3, the impurity region 105 may be divided into the two drains 107 and the common source 109 by the plurality of trenches 201T. The two drains 107 may be respectively formed between the plurality of trenches 201T and the plurality of isolation layers 111. The common source 109 may be formed between the plurality of trenches 201T. The electric type and the dopant concentration of the two drains 107 and the common source 109 are the same as the electric type and the dopant concentration of the impurity region 105, respectively.

In some embodiments, before the plurality of word line structures 201 are formed, an etch loss of a surface of the plurality of trenches 201T may be cured. For example, a sacrificial oxide is formed by a thermal oxidation process to cure the surface of the plurality of trenches 201T. The sacrificial oxide may be removed before forming the plurality of word line structures 201.

With reference to FIG. 4, the plurality of word line structures 201 may be formed in the plurality of trenches 201T, respectively and correspondingly. For brevity, clarity, and convenience of description, only one word line structure 201 is described. The word line structure 201 may include a word line dielectric layer 203, a word line barrier layer 205, a word line conductive layer 207, and a word line capping layer 209.

With reference to FIG. 4, the word line dielectric layer 203 may be conformally form on the surface of the trench 201T. The word line dielectric layer 203 may have a U-shaped cross-sectional profile. In some embodiments, the word line dielectric layer 203 may be formed by a thermal oxidation process. For example, the word line dielectric layer 203 may be formed by oxidizing the surface of the trench 201T. In some embodiments, the word line dielectric layer 203 may be formed by a deposition process such as a chemical vapor deposition or an atomic layer deposition. The word line dielectric layer 203 may include a high-k material, an oxide, a nitride, an oxynitride or combinations thereof. The high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof. Other high-k materials may be selectively used for the high-k material. In some embodiments, after a liner polysilicon layer is deposited, the word line dielectric layer 203 may be formed by radical-oxidizing the liner polysilicon layer. In some embodiments, after a liner silicon nitride layer is formed, the word line dielectric layer 203 may be formed by radical-oxidizing the liner silicon nitride layer.

With reference to FIG. 4, the word line barrier layer 205 may be conformally formed on the word line dielectric layer 203. The word line barrier layer 205 may have a U-shaped cross-sectional profile. The word line barrier layer 205 may be, for example, titanium nitride. The word line barrier layer 205 may be formed by, for example, atomic layer deposition. The word line barrier layer 205 may prevent metal ion in the word line conductive layer 207 diffusing into the substrate 101 and may improve the adhesion between the word line dielectric layer 203 and the word line conductive layer 207. In some embodiments, the word line barrier layer 205 may be optional.

With reference to FIG. 4, the word line conductive layer 207 may be formed on the word line barrier layer 205 (or on the word line dielectric layer 203 if the word line barrier layer 205 is omitted). In some embodiments, in order to form the word line conductive layer 207, a conductive layer (not shown for clarity) may be formed to fill the trench 201T, and subsequently a recessing process may be performed. The recessing process may be performed as an etch-back process or sequentially performed as the planarization process and an etch-back process. The word line conductive layer 207 may have a recessed shape that partially fills the trench 201T. That is, a top surface of the word line conductive layer 207 may be at a vertical level VL1 lower than the top surface 101TS of the substrate 101. In some embodiments, the word line conductive layer 207 may include a metal, a metal nitride, or a combination thereof. For example, the word line conductive layer 207 may be formed of titanium nitride, tungsten, or a titanium nitride/tungsten. After the titanium nitride is conformally formed, the titanium nitride/tungsten may have a structure where the trench 201T is partially filled using tungsten. The titanium nitride or the tungsten may be solely used for the word line conductive layer 207. In some embodiments, the word line conductive layer 207 may be formed of, for example, a conductive material such as polycrystalline silicon, polycrystalline silicon germanium, or a combination thereof. In some embodiments, the word line conductive layer 207 may be doped with a dopant such as phosphorus, arsenic, antimony, or boron. In some embodiments, the word line conductive layer 207 may be formed of, for example, tungsten, aluminum, titanium, copper, the like, or a combination thereof.

In some embodiments, the word line capping layer 209 may be formed on the word line conductive layer 207, on the word line barrier layer 205, and on the word line dielectric layer 203. The top surface of the word line capping layer 209 may be substantially coplanar with the top surface 101TS of the substrate 101. In some embodiments, the word line capping layer 209 may be formed of, for example, silicon oxide, or silicon nitride. The word line capping layer 209 may be formed by, for example, sequentially performed chemical vapor deposition and planarization process.

In some embodiments, the word line capping layer 209 may be formed of a stacked layer including a bottom capping layer (not shown for clarity) and a top capping layer (not shown for clarity). The bottom capping layer may be formed on the word line conductive layer 207. The top capping layer may be formed on the bottom capping layer. The bottom capping layer may be formed of an insulating material having a dielectric constant of about 4.0 or greater. The insulating material may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or a mixture thereof. The top capping layer may be formed of a low dielectric-constant material such as silicon oxide, fluoride-doped silicate, or the like. The top capping layer formed of the low dielectric-constant material may reduce electric field at the top surface 101TS of the substrate; therefore, leakage current may be reduced.

With reference to FIG. 1 and FIGS. 5 to 8, at step S15, a bit line contact 309 may be formed on the common source 109, a bit line structure 301 may be formed on the bit line contact 309, and a plurality of bottom contacts 407 may be formed on the two drains 107.

Figure 5:
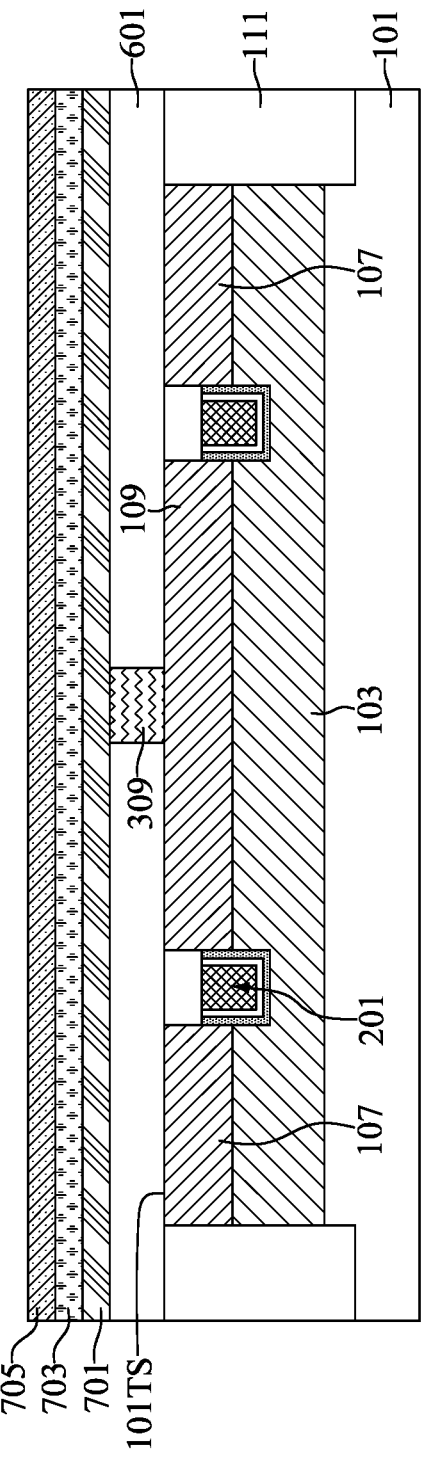

With reference to FIG. 5, a first dielectric layer 601 may be formed on the substrate 101. The first dielectric layer 601 may include, for example, silicon dioxide, undoped silicate glass, fluorosilicate glass, borophosphosilicate glass, a spin-on low-k dielectric layer, a chemical vapor deposition low-k dielectric layer, or a combination thereof. The term "low-k" as used throughout the present application denotes a dielectric material that has a dielectric constant of less than silicon dioxide. In some embodiments, the first dielectric layer 601 may include a self-planarizing material such as a spin-on glass or a spin-on low-k dielectric material such as SiLK™. The use of a self-planarizing dielectric material may avoid the need to perform a subsequent planarizing step. In some embodiments, the first dielectric layer 601 may be formed by a deposition process including, for example, chemical vapor deposition, plasma enhanced chemical vapor deposition, evaporation, or spin-on coating.

With reference to FIG. 5, the bit line contact 309 may be formed in the first dielectric layer 601 and electrically connected to the common source 109. The bit line contact 309 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The bit line contact 309 may be formed by, for example, a damascene method. Generally, in a damascene method, one or more dielectric materials, such as the low-k dielectric materials (i.e., having a dielectric constant (k)<4.0), are deposited and pattern etched to form the vertical interconnects, also known as vias, and horizontal interconnects, also known as lines. Conductive materials, such as copper containing materials, and other materials, such as barrier layer materials used to prevent diffusion of copper containing materials into the surrounding low-k dielectric, are then inlaid into the etched pattern. Any excess copper containing materials and excess barrier layer material-external to the etched pattern, such as on the field of the substrate, is then removed.

With reference to FIG. 5, a bottom conductive layer 701, a middle conductive layer 703, and a top insulating layer 705 may be sequentially formed on the first dielectric layer 601. The bottom conductive layer 701 may be formed of, for example, a doped semiconductor material (e.g., doped silicon or doped germanium), a metallic material (e.g., titanium, tantalum, tungsten, copper, or aluminum), or a metal-semiconductor compound (e.g., tungsten silicide, cobalt silicide, or titanium silicide). The middle conductive layer 703 may be formed of, for example, a conductive metal nitride (e.g., titanium nitride or tantalum nitride). The top insulating layer 705 may be formed of, for example, silicon nitride, silicon oxynitride, silicon nitride oxide, the like, or a combination thereof. The bottom conductive layer 701, the middle conductive layer 703, and the top insulating layer 705 may be formed by, for example, chemical vapor deposition, plasma enhanced chemical vapor deposition, atomic layer deposition, or other applicable deposition processes.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

Figure 6:
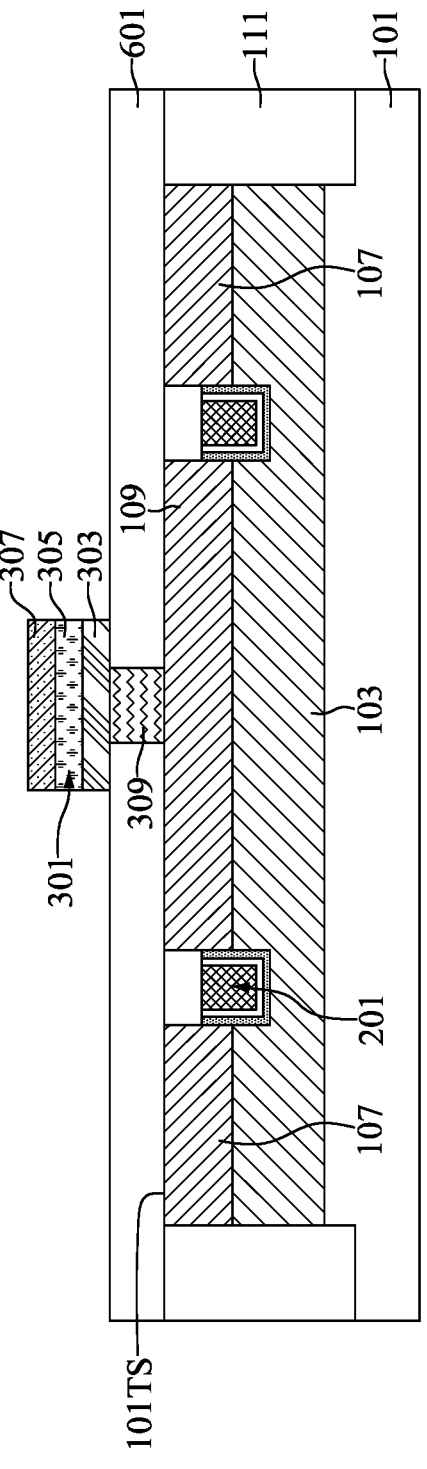

With reference to FIG. 6, an etch process, such as an anisotropic dry etch process, may be performed with a bit line mask (not shown for clarity) as a pattern guide to remove portions of the top insulating layer 705, portions of the middle conductive layer 703, and portions of the bottom conductive layer 701. In some embodiments, the etch process may be a multistep etch process. After the etch process, the remaining bottom conductive layer 701 may be turned into a bit line bottom layer 303, the middle conductive layer 703 may be turned into a bit line middle layer 305, and a top insulating layer 705 may be turned into a bit line capping layer 307. The bit line bottom layer 303, the bit line middle layer 305, and the bit line capping layer 307 may together configure the bit line structure 301.

Figure 7:
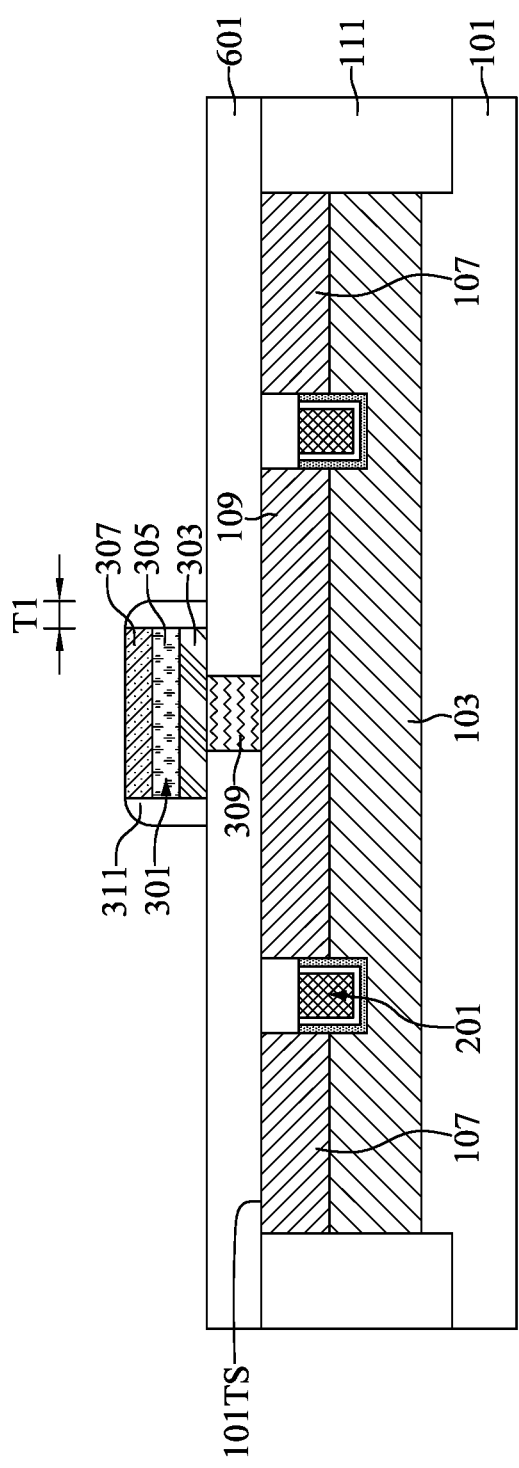

With reference to FIG. 7, a layer of spacer material (not shown for clarity) may be conformally formed to cover the first dielectric layer 601 and the bit line structure 301. The spacer material may include silicon dioxide, silicon nitride, boron nitride, a semiconductor carbide, a semiconductor oxynitride, or a dielectric metal oxide. The layer of spacer material may be formed by a deposition process such as, for example, chemical vapor deposition, plasma enhanced chemical vapor deposition, or atomic layer deposition. A spacer etch process may be performed to remove the layer of spacer material formed on the top surface of the first dielectric layer 601 and on the top surface of the bit line structure 301. The remaining spacer material may concurrently form two bit line spacers 311 covering sidewalls of the bit line structure 301. The spacer etch process may be, for example, an anisotropic etch process such as reactive ion etching. In some embodiments, the thickness T1 of the two bit line spacers 311 may be between about 200 angstroms and about 1000 angstroms. In some embodiments, the thickness T1 of the two bit line spacers 311 may be between about 400 angstroms and about 800 angstroms.

Figure 8:
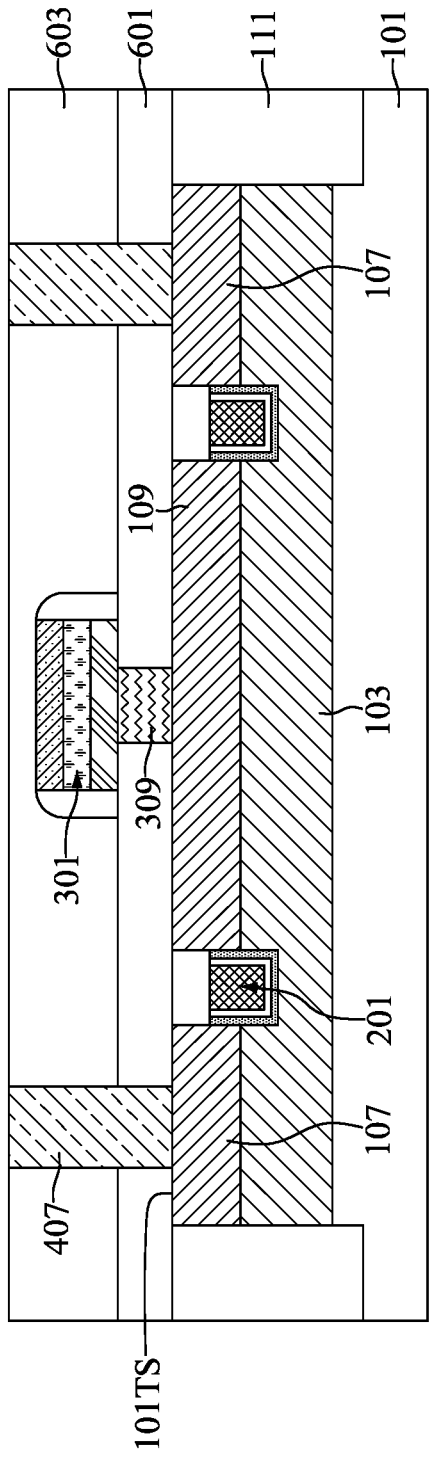

With reference to FIG. 8, a second dielectric layer 603 may be formed on the first dielectric layer 601. The second dielectric layer 603 may include, for example, silicon oxide, undoped silicate glass, fluorosilicate glass, borophosphosilicate glass, a spin-on low-k dielectric layer, a chemical vapor deposition low-k dielectric layer, or a combination thereof. In some embodiments, the second dielectric layer 603 may include a self-planarizing material such as a spin-on glass or a spin-on low-k dielectric material such as SiLK™. In some embodiments, the second dielectric layer 603 may be formed by a deposition process including, for example, chemical vapor deposition, plasma enhanced chemical vapor deposition, evaporation, or spin-on coating. In some embodiments, a planarization process, such as chemical mechanical polishing, may be performed to provide a substantially flat surface for subsequent processing steps.

With reference to FIG. 8, the plurality of bottom contacts 407 may be formed penetrating along the second dielectric layer 603 and the first dielectric layer 601, and on the two drains 107, respectively correspondingly. The plurality of bottom contacts 407 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of bottom contacts 407 may be formed by, for example, a damascene method similar to that illustrated in FIG. 5.

With reference to FIG. 1 and FIGS. 9 to 12, at step S17, an insulator film 713 may be formed on the plurality of bottom contacts 407, and a plurality of pad openings 401O may be formed to expose the plurality of bottom contacts 407.

Figure 9:
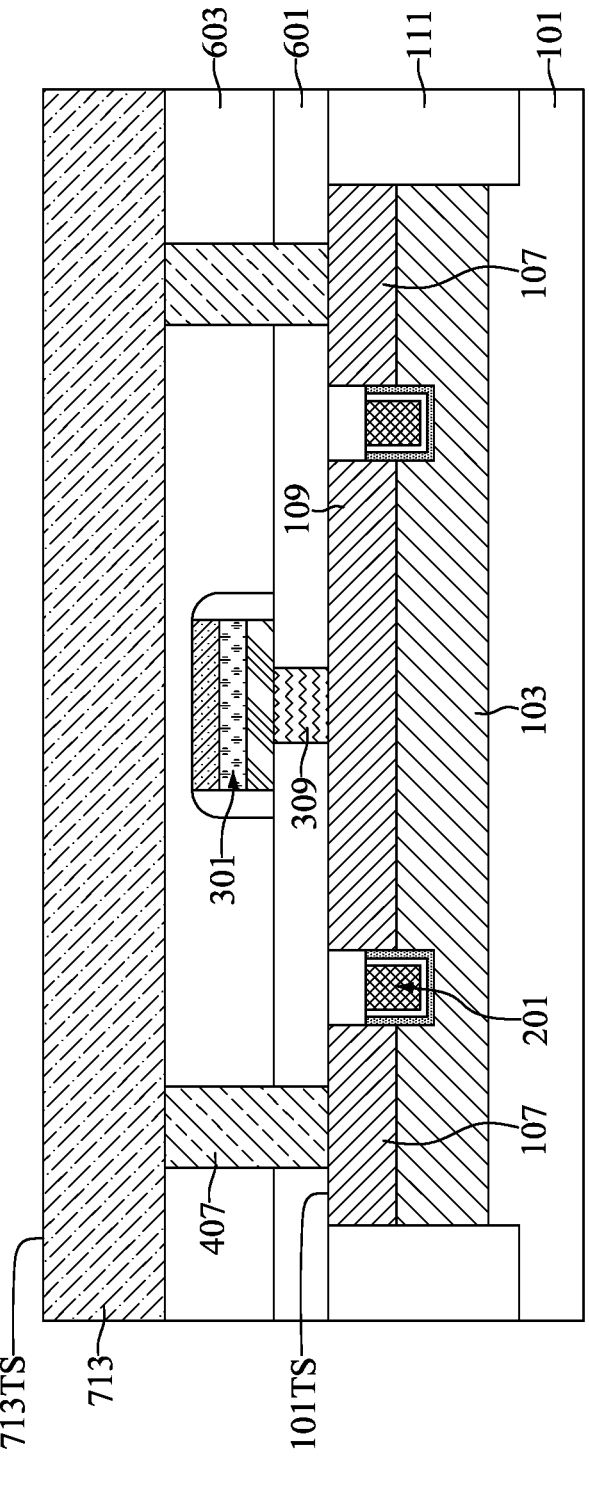

With reference to FIG. 9, the insulator film 713 may be formed on the first dielectric layer 601. In some embodiments, the insulator film 713 may include, for example, silicon oxide, undoped silicate glass, fluorosilicate glass, borophosphosilicate glass, a spin-on low-k dielectric layer, a chemical vapor deposition low-k dielectric layer, or a combination thereof. In some embodiments, the insulator film 713 may include a self-planarizing material such as a spin-on glass or a spin-on low-k dielectric material such as SiLK™. In some embodiments, the insulator film 713 may be formed by a deposition process including, for example, chemical vapor deposition, plasma enhanced chemical vapor deposition, evaporation, or spin-on coating. In some embodiments, the insulator film 713 and the second dielectric layer 603 may be formed of different materials.

In some embodiments, the insulator film 713 and the second dielectric layer 603 may be formed of the same material. In such situation, one or more etch stop layers (not shown) may be formed between the second dielectric layer 603 and the insulator film 713. Generally, the etch stop layer(s) may provide a mechanism to stop an etch process when forming conductive features. The etch stop layer(s) may be preferably formed of a dielectric material having a different etch selectivity from adjacent layers. For example, the etch stop layer(s) may be formed of SiN, SiCN, SiCO, CN, or the like, and may be deposited by chemical vapor deposition or plasma enhanced chemical vapor deposition.

With reference to FIG. 10, a first mask layer 707 may be formed on the insulator film 713. The first mask layer 707 may have the pattern of the plurality of pad openings 401O. In some embodiments, the first mask layer 707 may be a photoresist layer. In some embodiments, the first mask layer 707 may be a hard mask layer patterned with the pattern of the plurality of pad openings 401O.

With reference to FIG. 11, an opening etch process may be performed using the first mask layer 707 as a pattern guide to remove portions of the insulator film 713. In some embodiments, the etch rate ratio of the insulator film 713 to the second dielectric layer 603 (or to the etch stop layer) may be between about 100:1 and about 1.05:1, between about 15:1 and about 2:1, or between about 10:1 and about 2:1 during the opening etch process. After the opening etch process, the top surfaces of the plurality of bottom contacts 407 may be exposed through the plurality of pad openings 401O, respectively and correspondingly.

In some embodiments, a cleaning process may be performed after the formation of the plurality of pad openings 401O. The cleaning process may include applying a mixture of hydrogen and argon as a remote plasma source with a process temperature between about 250° C. and about 350° C. and a process pressure ranging between about 1 Torr and about 10 Torr in the presence of a bias energy applied to the equipment performing the cleaning process. The bias energy may be between about 0 W and 200 W. The cleaning process may remove oxide, originating from oxidation by oxygen in the air, from the top surface of the topmost conductive feature (e.g., the plurality of bottom contacts 407) exposed through the plurality of pad openings 401O without damaging the topmost conductive feature.

In some embodiments, a passivation process may be subsequently performed on the insulator film 713 and the plurality of pad openings 401O. The passivation process may include soaking the intermediate semiconductor device with a precursor such as dimethylaminotrimethylsilane, tetramethylsilane, or the like at a process temperature between about 200° C. and about 400° C. Ultraviolet radiation may be used to facilitate the passivation process. The passivation process may passivate sidewalls of the insulator film 713 exposed through the plurality of pad openings 401O by sealing surface pores thereof to reduce undesirable sidewall growth, which may affect the electric characteristics of the semiconductor device 1A, during subsequent processing steps. As a result, the performance and reliability of the semiconductor device 1A may be increased.

Figure 12:
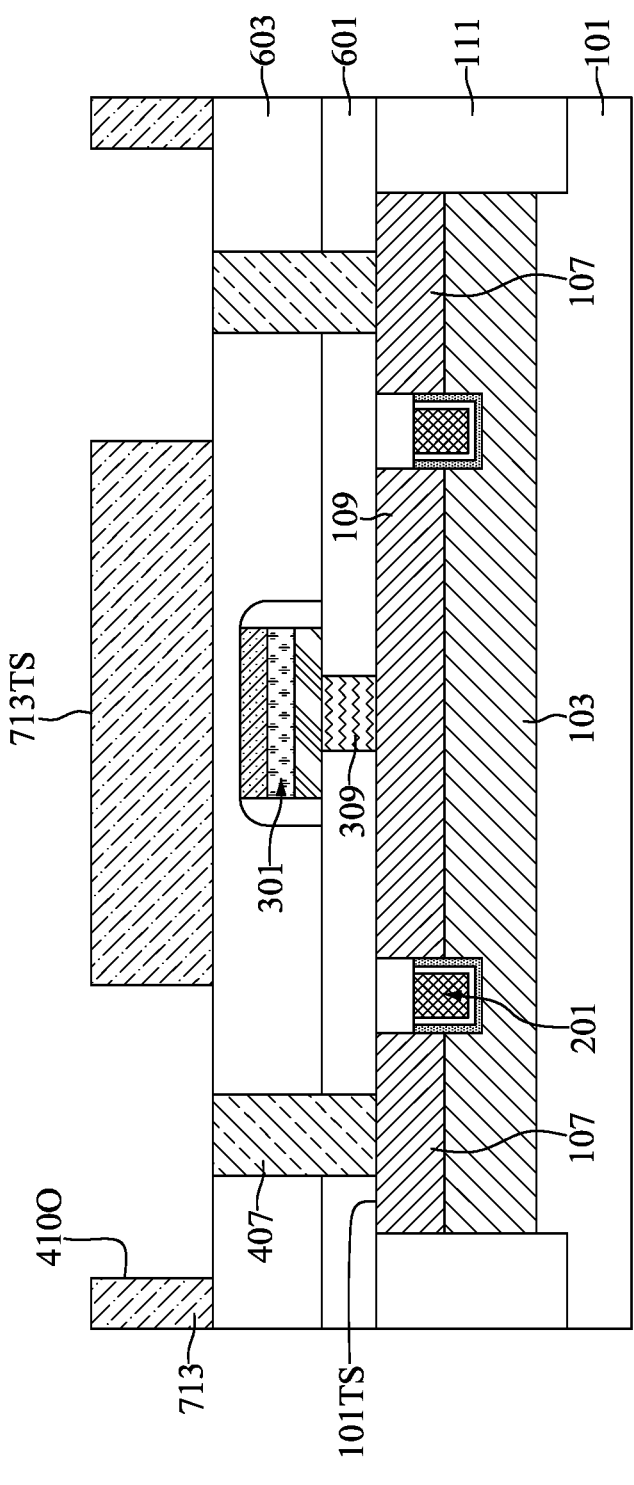

With reference to FIG. 12, after the plurality of pad openings 401O are formed, the first mask layer 707 may be removed by an ashing process or other applicable semiconductor process.

With reference to FIG. 1 and FIGS. 13 to 15, at step S19, a plurality of pad structures 401 may be formed in the plurality of pad openings 401O.

Figure 13:
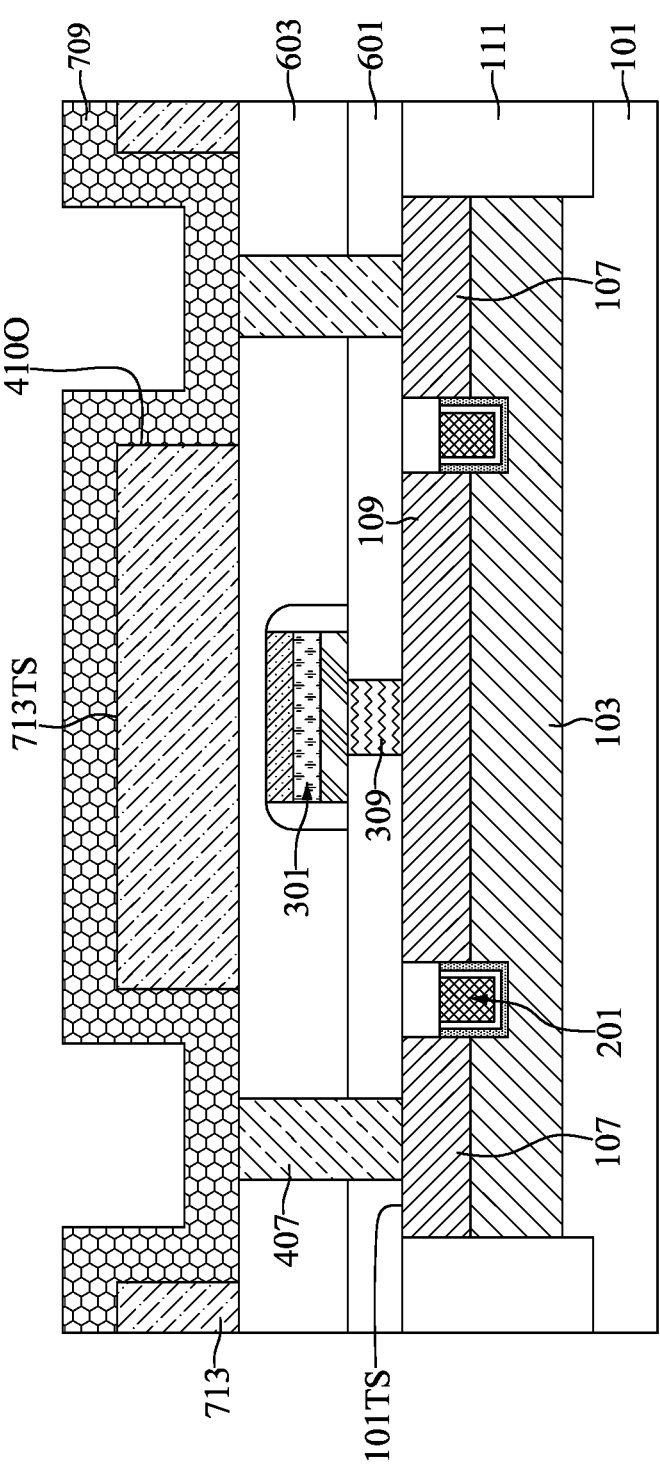

With reference to FIG. 13, a layer of first conductive material 709 may be conformally formed on the top surface 713TS of the insulator film 713 and in the plurality of pad openings 401O. In some embodiments, the first conductive material 709 may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The layer of first conductive material 709 may be formed by, for example, atomic layer deposition. Generally, the atomic layer deposition alternately supplies two (or more) different source gases one by one onto a process object under predetermined process conditions, so that chemical species is adsorbed to the process object at a single atomic layer level, and are deposited on the process object through surface reactions. For instance, first and second source gases are alternately supplied to a process object to flow along the surface thereof, thereby molecules contained in the first source gas adsorb to the surface, and molecules contained in the second source gas react with the adsorbed molecules originated from the first source gas to form a film of a thickness of a single molecule level. The above process steps are performed repeatedly, so that a high-quality dielectric film, specifically a film of a high dielectric constant (high-k), is formed on the process object.

With reference to FIG. 14, a under layer 711 may be formed on the layer of first conductive material 709 and may completely fill the plurality of pad openings 401O. In some embodiments, the under layer 711 may be a photoresist layer. In some embodiments, the under layer 711 may be an insulating layer having etch selectivity to the insulator film 713. It should be noted that no addition patterning is needed for the under layer 711. The under layer 711 filled in the plurality of pad openings 401O may serve as a buffer to prevent the layer of first conductive material 709 formed in the plurality of pad openings 401O from being damaged in subsequent semiconductor processes.

Figure 15:
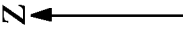

With reference to FIG. 15, a pad etch process may be performed to remove the layer of first conductive material 709 formed on the top surface 713TS of the insulator film 713. In some embodiments, the pad etch process may be, for example, an isotropic etch process. In some embodiments, the pad etch process may be, for example, an anisotropic etch process. In some embodiments, the etch rate ratio of the first conductive material 709 to the insulator film 713 may be between about 100:1 and about 1.05:1, between about 15:1 and about 2:1, or between about 10:1 and about 2:1 during the pad etch process.

In some embodiments, during the pad etch process, the etch rate to the first conductive material 709 and the etch rate to the under layer 711 may be substantially the same or may be close to each other. For example, the etch rate ratio of the first conductive material 709 to the under layer 711 may be between about 1.2:1 or about 1:1 during the pad etch process. In other words, there is no significant etching selectivity between the first conductive material 709 and the under layer 711 for the pad etch process. It means that the pad structure 401 may be formed by employing a general etch process, such as wet etch process, without carefully tailoring etch selectivity between the first conductive material 709 and the under layer 711. As a result, the complexity and the cost for forming the pad structure 401 may be reduced.

After the pad etch process, the remaining first conductive material 709 may be referred to as the plurality of pad structures 401. For brevity, clarity, and convenience of description, only one pad structure 401 is described. In some embodiments, the width W1 of the pad structure 401 may be greater than the width W2 of the bottom contact 407. The pad structure 401 may include a bottom portion 403 and two side portions 405. The bottom portion 403 may be horizontally disposed on the bottom contact 407 and electrically connected to the bottom contact 407. The width W3 of the bottom portion 403 may be greater than the width W2 of the bottom contact 407. The two side portions 405 may be disposed on two sides of the bottom portion 403 and extending along a direction parallel to a normal 101N of the top surface 101TS of the substrate 101. That is, the two side portions 405 may extend along the direction Z in FIG. 15. The bottom portion 403 may be distant form the insulator film 713 by the two side portions 405 interposed therebetween, respectively and correspondingly. In some embodiments, the pad structure 401 may have a U-shaped cross-sectional profile.

The top surfaces 405TS of the two side portions 405 may be at a vertical level VL2 greater than a vertical level VL3 of the top surface 403TS of the bottom portion 403. In some embodiments, the top surfaces 405TS of the two side portions 405 may be at a vertical level VL2 lower than a vertical level VL4 of the top surface 713TS of the insulator film 713. In other words, the insulator film 713 may surround the pad structure 401. In some embodiments, the top surfaces 405TS of the two side portions 405 and the top surface 713TS of the insulator film 713 may be substantially coplanar.

In some embodiments, the under layer 711 may be remained on the bottom portion 403 and between the two side portions 405. The under layer 711 may serve as a buffer to prevent the first conductive material 709 formed in the pad opening 401O being etched during the pad etch process so that a general etch process are sufficient for the formation of the pad structure 401. In addition, with the presence of the under layer 711, no additional mask is needed for patterning the position and the shape of the pad structure 401. As a result, the complexity and the cost for forming the pad structure 401 may be reduced. After the pad etch process, the remaining under layer 711 may be removed.

Figure 17:
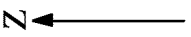

With reference to FIGS. 1, 16, and 17, at step S21, a plurality of top contacts 409 may be formed on the plurality of pad structures 401, and a plurality of capacitor structures 501 may be formed on the plurality of top contacts 409.

With reference to FIG. 16, a third dielectric layer 605 may be formed to cover the plurality of pad structures 401 and the insulator film 713. The third dielectric layer 605 may include, for example, silicon oxide, undoped silicate glass, fluorosilicate glass, borophosphosilicate glass, a spin-on low-k dielectric layer, a chemical vapor deposition low-k dielectric layer, or a combination thereof. In some embodiments, the third dielectric layer 605 may include a self-planarizing material such as a spin-on glass or a spin-on low-k dielectric material such as SiLK™. In some embodiments, the third dielectric layer 605 may be formed by a deposition process including, for example, chemical vapor deposition, plasma enhanced chemical vapor deposition, evaporation, or spin-on coating. In some embodiments, a planarization process, such as chemical mechanical polishing, may be performed to provide a substantially flat surface for subsequent processing steps.

With reference to FIG. 16, the plurality of top contacts 409 may be formed in the third dielectric layer 605 and on the plurality of pad structures 401, respectively and correspondingly. For brevity, clarity, and convenience of description, only one top contact 409 is described. In some embodiments, the top contact 409 may be formed on the bottom portion 403 of the pad structure 401. In some embodiments, the width W4 of the top contact 409 may be less than the width W3 of the bottom portion 403 of the pad structure 401. The top contact 409 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The top contact 409 may be formed by, for example, a damascene method similar to that illustrated in FIG. 5.

With reference to FIG. 17, a fourth dielectric layer 607 may be formed on the third dielectric layer 605. The fourth dielectric layer 607 may include, for example, silicon oxide, undoped silicate glass, fluorosilicate glass, borophosphosilicate glass, a spin-on low-k dielectric layer, a chemical vapor deposition low-k dielectric layer, or a combination thereof. In some embodiments, the fourth dielectric layer 607 may include a self-planarizing material such as a spin-on glass or a spin-on low-k dielectric material such as SiLK™. In some embodiments, the fourth dielectric layer 607 may be formed by a deposition process including, for example, chemical vapor deposition, plasma enhanced chemical vapor deposition, evaporation, or spin-on coating. In some embodiments, a planarization process, such as chemical mechanical polishing, may be performed to provide a substantially flat surface for subsequent processing steps.

With reference to FIG. 17, the plurality of capacitor structures 501 may be formed in the fourth dielectric layer 607. The plurality of capacitor structures 501 may be formed on the plurality of top contacts 409, respectively and correspondingly. The capacitor structures 501 may be electrically coupled to the two drains 107 through the plurality of top contacts 409, the plurality of pad structures 401, and the plurality of bottom contacts 407. For brevity, clarity, and convenience of description, only one capacitor structure 501 is described. The capacitor structure 501 may include a capacitor bottom conductive layer 503, a capacitor insulating layer 505, and a capacitor top conductive layer 507.

With reference to FIG. 17, the capacitor bottom conductive layer 503 may be inwardly formed in the fourth dielectric layer 607. In some embodiments, the capacitor bottom conductive layer 503 may have a U-shaped cross-sectional profile. The bottom of the capacitor bottom conductive layer 503 may contact the top surface of the top contact 409. The capacitor bottom conductive layer 503 may be formed of, for example, doped polysilicon, metal, metal nitride, or metal silicide.

With reference to FIG. 17, the capacitor insulating layer 505 may be formed on the capacitor bottom conductive layer. In some embodiments, the capacitor insulating layer 505 may have a U-shaped cross-sectional profile. The capacitor insulating layer 505 may be formed of a single layer including an insulating material having a dielectric constant of about 4.0 or greater. The capacitor insulating layer 505 may have a thickness between about 1 angstrom and about 100 angstroms. Alternatively, in some embodiments, the capacitor insulating layer 505 may be formed of a stacked layer consisting of silicon oxide, silicon nitride, and silicon oxide. Alternatively, in some embodiments, the capacitor insulating layer 505 may be formed of a stacked layer consisting of zirconium oxide, aluminum oxide, and zirconium oxide.

With reference to FIG. 17, the capacitor top conductive layer 507 may be formed on the capacitor insulating layer 505. The capacitor top conductive layer 507 may be formed of, for example, doped polysilicon, silicon germanium alloy, or metal.

Conventionally, the capacitor structure 501 and the two drain 107 may be electrically coupled by a contact having high aspect ratio. To fabricate such high aspect ratio contact, the complexity and the cost of process is tremendous.

In contrast, the pad structure 401 in the present disclosure may serve as a bridge to connect the bottom contact 407 and the top contact 409 which have relative low aspect ratio. As a result, the complexity and the cost for fabrication of the semiconductor device 1A may be reduced.

Conventionally, pad structures may be formed by patterning a blanket metal layer. The patterning process may include a photolithography process and a subsequent etch process. However, due to the etch resistance nature of metal, the etch process may be under-etched and there are metal residue may be remained between adjacent pad structures to form a "pad bridge" which will cause short. The short will cause bit fail and yield loss.

In contrast, in the present disclosure, the positions of the plurality of pad structures 401 are pre-defined using the plurality of pad openings 401O in the insulator film 713. Subsequently, the layer of first conductive material 709 is refilled into the plurality of pad openings 401O and a pad etch process is employed to remove undesired first conductive material 709 so as to form the plurality of pad structures 401. Therefore, the risk of under etching during a blanket metal etch process is prevented. Accordingly, the yield of fabrication of the semiconductor device 1A may be improved.

Figure 18:
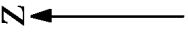
FIGS. 18 to 20 illustrate, in schematic cross-sectional view diagrams, semiconductor devices in accordance with some embodiments of the present disclosure.
Figure 19:
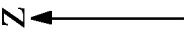
Figure 20:
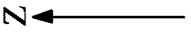

FIGS. 18 to 20 illustrate, in schematic cross-sectional view diagrams, semiconductor devices 1B, 1C, and 1D in accordance with some embodiments of the present disclosure.

With reference to FIG. 18, the semiconductor device 1B may have a structure similar to that illustrated in FIG. 17. The same or similar elements in FIG. 18 as in FIG. 17 have been marked with similar reference numbers and duplicative descriptions have been omitted.

In the semiconductor device 1B, the width W4 the top contact 409 may be greater than the width W3 of the bottom portion 403 of the pad structure 401. The width W4 of the top contact 409 may be less than the width W1 of the pad structure 401. That is, the top contact 409 may completely cover the bottom portion 403 and partially cover the two side portions 405.

With reference to FIG. 19, the semiconductor device 1C may have a structure similar to that illustrated in FIG. 17. The same or similar elements in FIG. 19 as in FIG. 17 have been marked with similar reference numbers and duplicative descriptions have been omitted.

In the semiconductor device 1C, the under layer 711 may be completely consumed during the pad etch process. Therefore, the top surfaces 405TS may be over-etched during the pad etch process. As a result, the top surfaces 405TS of the two side portions 405 may have a rounding cross-sectional profile.

With reference to FIG. 20, the semiconductor device 1D may have a structure similar to that illustrated in FIG. 17. The same or similar elements in FIG. 20 as in FIG. 17 have been marked with similar reference numbers and duplicative descriptions have been omitted.

In the semiconductor device 1D, a barrier layer 411 may be disposed between the insulator film 713 and the pad structure 401, between the second dielectric layer 603 and the pad structure 401, and between the plurality of bottom contacts 407 and the pad structure 401. In some embodiments, the barrier layer 411 may have a U-shaped cross-sectional profile. The top surfaces 411TS of the barrier layer 411 and the top surface 405TS of the two side portions 405 of the pad structure 401 may be substantially coplanar. In some embodiments, the barrier layer 411 may have a thickness between about 10 angstroms and about 15 angstroms. In some embodiments, the barrier layer 411 may have a thickness between about 11 angstroms and about 13 angstroms. In some embodiments, the barrier layer 411 may be formed of, for example, titanium, titanium nitride, titanium silicon nitride, tantalum, tantalum nitride, tantalum silicon nitride, or a combination thereof. The barrier layer 411 may serve as an adhesive layer between the pad structure 401 and the insulator film 713 and between the pad structure 401 and the second dielectric layer 603.

Figure 21:
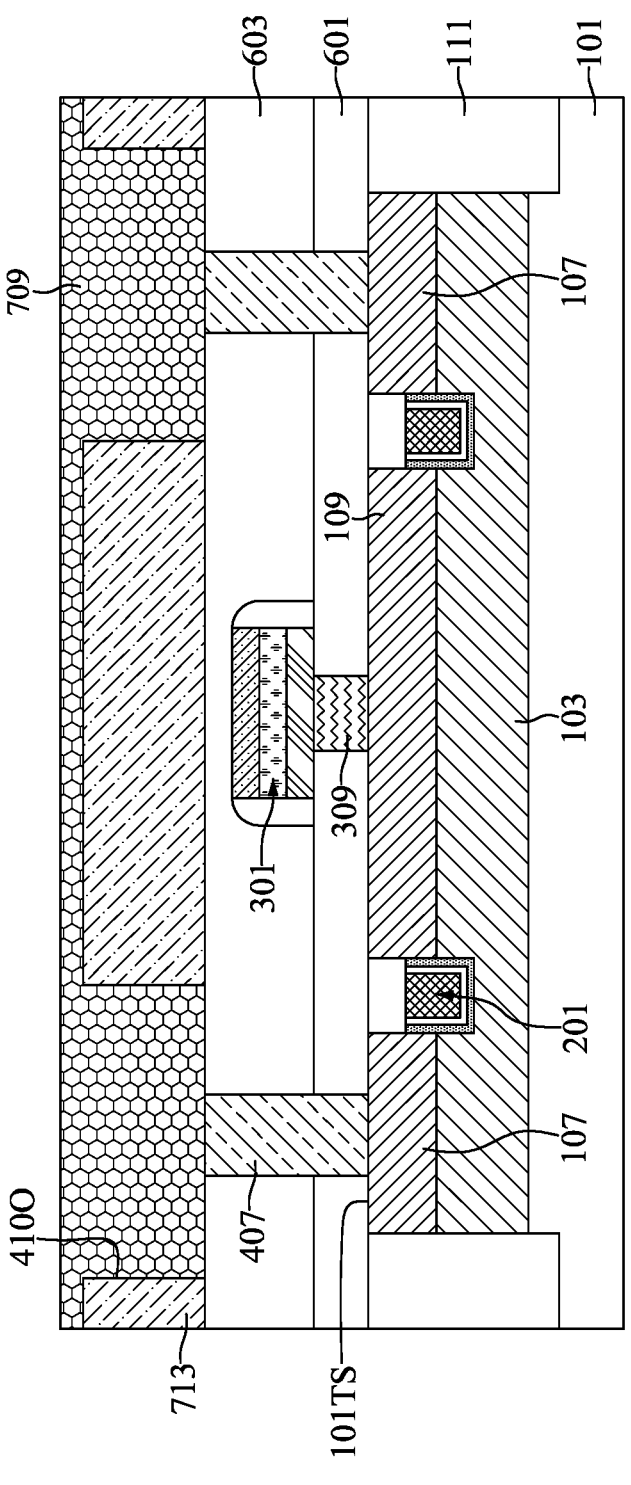
FIGS. 21 to 23 illustrate, in schematic cross-sectional view diagrams, a flow for fabricating a semiconductor device in accordance with another embodiment of the present disclosure.
Figure 22:
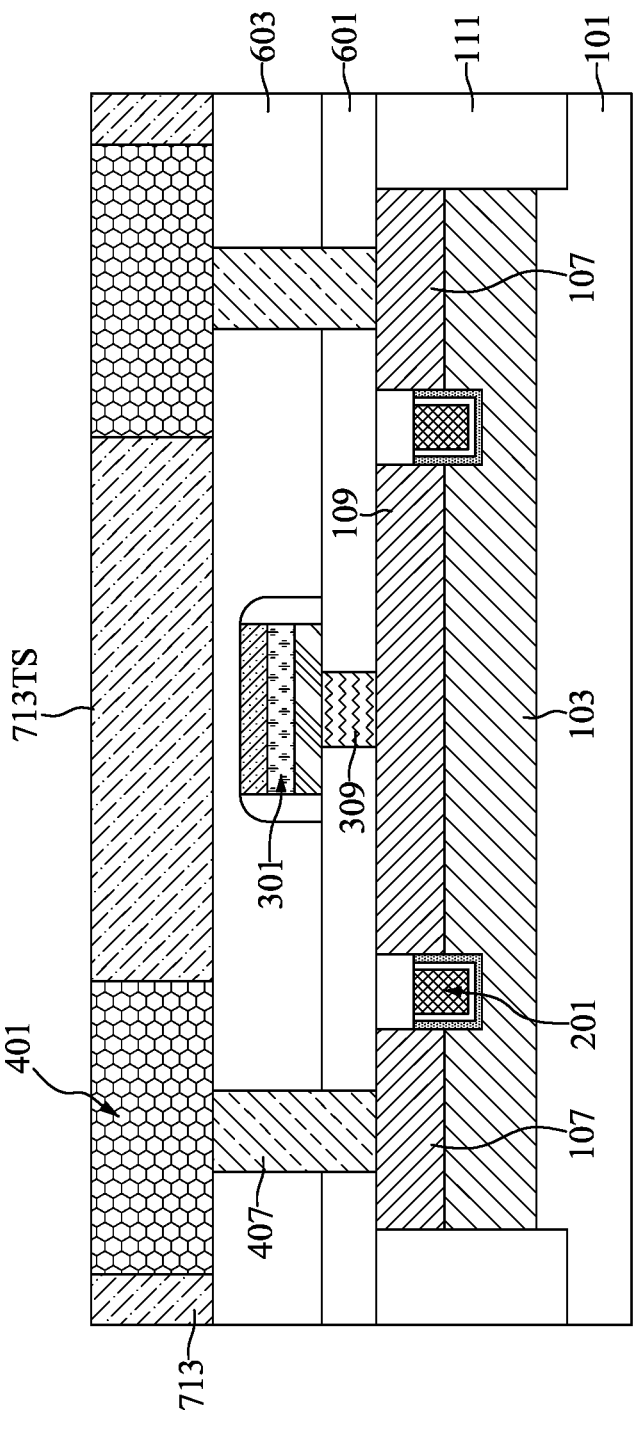
Figure 23:

FIGS. 21 to 23 illustrate, in schematic cross-sectional view diagrams, a flow for fabricating a semiconductor device 1D in accordance with another embodiment of the present disclosure.

With reference to FIG. 21, an intermediate semiconductor device may be fabricated with a procedure similar to that illustrated in FIGS. 2 to 12. The same or similar elements in FIG. 21 as in FIG. 12 have been marked with similar reference numbers and duplicative descriptions have been omitted. The layer of first conductive material 709 may be formed to completely fill the plurality of pad openings 401O.

With reference to FIG. 22, a planarization process, such as chemical mechanical polishing, may be performed until the top surface 713TS of the insulator film 713 is exposed to remove excess material, provide a substantially flat surface for subsequent processing steps, and concurrently form the plurality of pad structures 401.

With reference to FIG. 23, the plurality of top contacts 409, the plurality of capacitor structures 501, the third dielectric layer 605, and the fourth dielectric layer 607 may be formed with a procedure similar to that described in FIGS. 16 and 17, and descriptions thereof are not repeated herein.

One aspect of the present disclosure provides a semiconductor device including a substrate; a pad structure positioned above the substrate and including a bottom portion and two side portions, wherein the bottom portion is positioned parallel to a top surface of the substrate, and the two side portions are positioned on two sides of the bottom portion and extending along a direction parallel to a normal of the top surface of the substrate; and an insulator film surrounding the pad structure. A top surface of the insulator film is at a vertical level greater than a vertical level of a top surface of the pad structure.

Another aspect of the present disclosure provides a method for fabricating a semiconductor device including providing a substrate including a top surface; forming a dielectric layer on the substrate; forming an insulator film on the dielectric layer; patterning the insulator film to form a pad opening along the insulator film and expose a portion of the dielectric layer; conformally forming a layer of first conductive material on a top surface of the insulator film and in the pad opening; forming an under layer to completely fill the pad opening; and removing the layer of first conductive material formed on the top surface of the insulator film to form a pad structure. The pad structure includes a bottom portion and two side portions, the bottom portion is formed parallel to the top surface of the substrate, and the two side portions are formed on two sides of the bottom portion and extending along a direction parallel to a normal of the top surface of the substrate.

Due to the design of the semiconductor device of the present disclosure, the pre-defined pad openings 401O in the insulator film 713 and subsequently formed pad structures 401 may prevent the risk of under etching during a blanket metal etch process. As a result, the yield of fabrication of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a pad structure positioned above the substrate and comprising a bottom portion and two side portions, wherein the bottom portion is positioned parallel to a top surface of the substrate, and the two side portions are positioned on two sides of the bottom portion and extending along a direction parallel to a normal of the top surface of the substrate;
an insulator film surrounding the pad structure;
a bottom contact positioned under the pad structure and contacting the bottom portion of the pad structure; and
a top contact positioned on the bottom portion of the pad structure;
wherein a top surface of the insulator film is at a vertical level greater than a vertical level of a top surface of the pad structure.

2. The semiconductor device of claim 1, wherein top surfaces of the two side portions are at a vertical level greater than a vertical level of a top surface of the bottom portion.

3. The semiconductor device of claim 1, wherein the top surfaces of the two side portions have a rounding cross-sectional profile.

4. The semiconductor device of claim 1, wherein a width of the top contact is less than a width of the pad structure.

5. The semiconductor device of claim 1, wherein a width of the top contact is greater than a width of the bottom portion.

6. The semiconductor device of claim 1, wherein a width of the bottom contact is less than a width of the bottom portion, wherein a width of the top contact is greater than the width of the bottom contact.

7. The semiconductor device of claim 1, further comprising a drain positioned in the substrate and electrically coupled to the pad structure through the bottom contact.

8. The semiconductor device of claim 1, further comprising a capacitor structure positioned above the pad structure and electrically coupled to the pad structure through the top contacts.

* * * * *